United States Patent [19]

Wei

[11] Patent Number: 4,787,047
[45] Date of Patent: Nov. 22, 1988

[54] ELECTRICALLY ERASABLE FUSED PROGRAMMABLE LOGIC ARRAY

[75] Inventor: James Y. Wei, Santa Clara, Calif.

[73] Assignee: Intersil, Santa Clara, Calif.

[21] Appl. No.: 714,866

[22] Filed: Mar. 22, 1985

[51] Int. Cl.$^4$ .............................................. G06F 7/38
[52] U.S. Cl. .................................... 364/716; 307/465
[58] Field of Search ............... 364/716; 307/465, 468, 307/469, 200 B; 365/200, 218, 185

[56] References Cited

U.S. PATENT DOCUMENTS

| | | | |
|---|---|---|---|
| 4,399,523 | 8/1983 | Gerber et al. | 365/218 |
| 4,422,072 | 12/1983 | Cavlan | 340/825.87 |
| 4,490,812 | 12/1984 | Guterman | 307/465 X |
| 4,495,427 | 1/1985 | Cartwright, Jr. | 364/716 X |
| 4,503,520 | 3/1985 | Kyomasu et al. | 365/177 |
| 4,508,977 | 4/1985 | Page et al. | 364/716 X |
| 4,546,273 | 10/1985 | Osman | 307/468 |
| 4,546,454 | 10/1985 | Gupta et al. | 365/200 |
| 4,558,344 | 12/1985 | Perlegos | 365/185 X |
| 4,580,247 | 4/1986 | Adam | 365/200 |
| 4,596,938 | 6/1986 | Cartwright, Jr. | 307/450 X |

FOREIGN PATENT DOCUMENTS

WO85/0316 7/1985 PCT Int'l Appl.

OTHER PUBLICATIONS

Roth, Jr., "*Fundamentals of Logic Design*", West Publishing Company, Second edition, 1979, p. 511.

Hsieh et al., "*Electrically Aterable Programmable Logic Array (EAPLA)*", International Electron Devices Meeting Technical Digest, Publ.:IEEE, 1980, pp. 598-601.

*Primary Examiner*—Gary V. Harkcom
*Assistant Examiner*—Tan V. Mai
*Attorney, Agent, or Firm*—S. C. Corwin; H. I. Schanzer; B. E. Morris

[57] ABSTRACT

A programmable logic gate array employing a plurality of reprogrammable fuses having a logical NAND characteristic for logically connecting selected inputs to selected logic gates. The fuses are selectively programmed for providing appropriate signals to allow three modes of operation of the logic gate array; programming, erasure and normal logic operation.

29 Claims, 4 Drawing Sheets

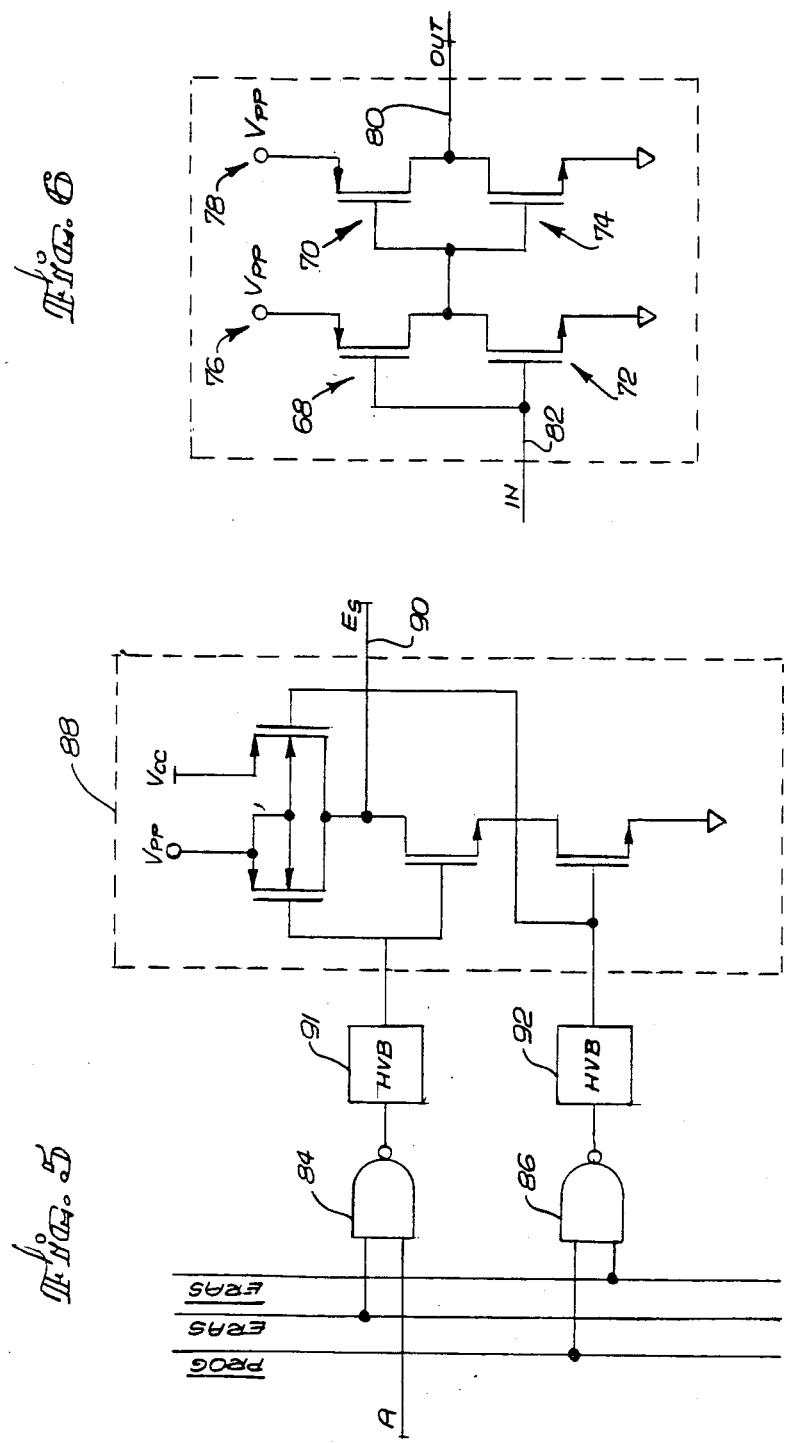

ELECTRICALLY ERASABLE FUSED PROGRAMMABLE LOGIC ARRAY

BACKGROUND OF THE INVENTION

1. Field of the Invention

This invention relates to arrays of logic gates capable of being programmed and reprogrammed. In particular, this invention relates to programmable logic arrays employing electrically erasable fuses for the programming capability.

2. Background of the Invention

Programmable logic arrays are arrays of logic gates, typically an array of AND gates leading into an array of OR gates, interconnected so as to allow implementation of a large number of logic equations. Fuses are employed at the interconnections between the logic gates and inputs to allow programming of the array by blowing selected fuses. A one-time programmable logic array circuit of this type is disclosed in U.S. Pat. No. 4,124,899 to Birkner et al. The term programmable logic array or PLA is generally used to refer to logic arrays where a programmable array of AND gates is connected to a fixed array of OR gates and the term programmable read only memory or PROM usually refers to an array having a fixed array of AND gates and a programmable OR array. The term programmable logic array or PLA as used here, however, refers to any programmable array of logic gates and thus encompasses both programmable AND arrays and programmable OR arrays.

Programmable logic arrays have many applications stemming from their capability to implement a wide variety of logic equations on a single integrated circuit. In particular, such programmable logic arrays make effective interfaces between large scale integrated circuits and the specific circuit board requirements of a design engineer. A disadvantage of systems employing blown fuses for programming, however, is their one-time only programmability. For example, if a mistake is made in the original programming of the logic array the entire integrated circuit is useless and has to be discarded. Also in a design environment flexibility to try different logic designs is desired. In a one-time programmable logic array a new integrated circuit logic array must be used for each new design choice with resultant expense.

Another shortcoming of the prior art one-time programmable logic array is the relatively high voltage needed to blow the fuses in the programming of the array. Such programming requires a high voltage to be applied to selected pins of the programmable logic array integrated circuit requiring a special programming device. One time programmable logic arrays cannot be completely tested prior to delivery to customers by the manufacturer, since doing so would destroy programmability.

A class of reprogrammable logic arrays is known in the prior art in the form of so-called erasable programmable read only memories, or EPROMs. EPROM logic arrays utilize programmable transistors instead of fuses to program the logic array. In the case of EPROMS the programmable array is an array of OR gates and, as the name implies, such arrays are used as memory devices. Such EPROM devices typically employ a floating gate MOSFET transistor which may be programmed into a conducting or nonconducting state. The programmable floating gate transistors may be either erased by application of ultraviolet light or by applying an electrical signal to remove the charge from the floating gate. The latter are referred to as electrically erasable PROMs or $E^2$ PROMs. The above noted two types of reprogrammable logic arrays generally suffer from a primary disadvantage of speed in programming and speed in operation of the logic functions. The ultraviolet erasable type usually suffers from a long time period required to erase the programmable transistor. Furthermore, in ultraviolet erasable logic arrays the entire array is typically erased simultaneously. Both types also suffer from delay due to the turning on of the floating gate transistor which often has a much higher capacitance, and is accordingly much slower, than a normal MOSFET transistor. Another disadvantage of currently available reprogrammable logic arrays is the lack of an implementation having an effective architecture for controlling programming and erasing of arrays with large numbers of gates.

The electrically erasable transistor fuse has also been suggested for other types of logic arrays than EPROMs in IEEE publication CH1616-2, 1980, Electrically Alterable Programmable Logic Array (EAPLA) by Li N. Chsieh, R. A. Wood and P. P. Wang. This reprogrammable logic array, however, utilizes a different form of electrically erasable transistor than is common in the art and its reliability and effectivenss are unclear. The fuse employed also would be quite slow due to the effect of the high capacitance of the floating gate transistor during read operations. Also, the architecture for programming the array is not shown in detail but appears to require a relatively large number of lines to program and read the array and have considerable power consumption and space requirements.

SUMMARY OF THE INVENTION

Accordingly, it is an object of the present invention to provide an improved programmable logic array employing electrically erasable fuses.

It is a further object of the present invention to provide a programmable logic array having improved speed and improved system efficiency.

It is a further object of the present invention to provide a programmable logic array having an improved architecture for controlling programming and logic operations.

The above and other objects are accomplished in a programmable logic array according to the present invention which includes an electrically erasable fuse having a floating gate transistor which is maintained in a DC conductive state when such fuse is programmed. It has been found that such an arrangement can significantly increase switching speeds. In one embodiment of the present invention, the fuse and array of logic gates may be implemented in CMOS.

The illustrated embodiment also employs programming means coupled to the fuses in the logic array to allow effective programming and reprogramming of the fuses by application of appropriate programming signals. Said programming means allows control of the three operating modes of the logic array: programming, erasure and normal logic operations; with relatively few control signals and control lines.

DESCRIPTION OF THE DRAWINGS

FIG. 5 is a block schematic diagram of one embodiment of an erase signal control circuit employed in the present invention.

FIG. 6 is a schematic diagram of a high voltage buffer circuit employed in one embodiment of the circuit of FIGS. 4 and 5.

DESCRIPTION OF THE ILLUSTRATED EMBODIMENT

A programmable logic array or PLA generally may be defined as a logic gate array having an arbitrary number of inputs leading into an array of logic gates and having an arbitrary number of outputs. Since all general logic equations can be made up from combinations of AND gates with inverter gates in conjunction with OR gates and inverter gates, in practice a programmable logic array will often comprise an OR gate array or an AND gate array or both.

Figure 1:
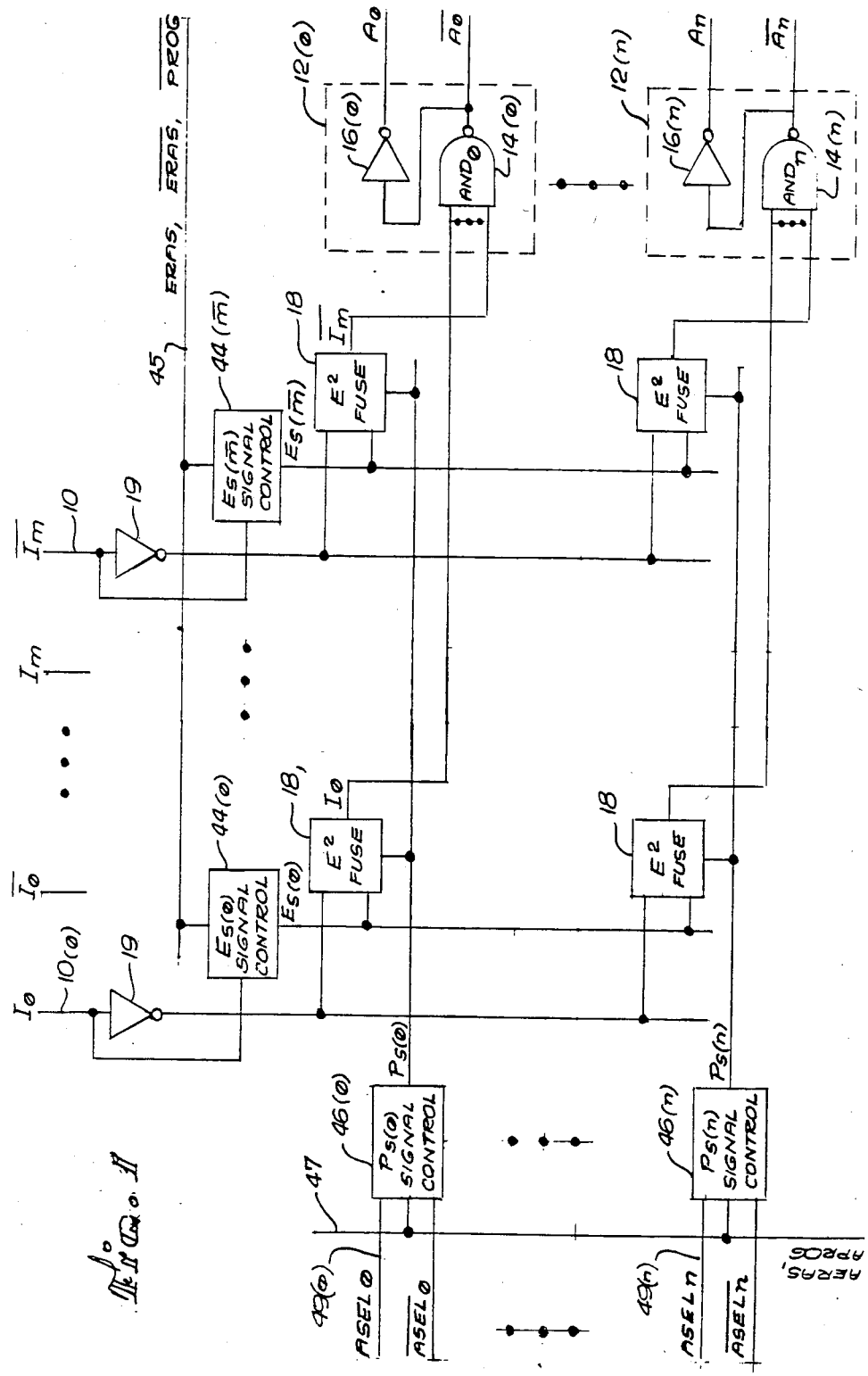
FIG. 1 is a block schematic drawing of a programmable AND gate array of the present invention.

Referring to FIG. 1, an embodiment of a programmable AND array of the present invention is shown in block schematic form. The general programmable AND array shown in FIG. 1 has $2(m+1)$ inputs, designated $10(o)$, $10(\bar{o})$, $10(1)$, $10(\bar{1})$ ... $10(\bar{m})$ for receiving input signals $I_o$, $\bar{I}_o$, ... $I_m$, $\bar{I}_m$, respectively. The AND arrays also has $n+1$ AND gates designated $12(o)$, $12(1)$, $12(2)$ ... $(12(n))$. In the embodiment shown in FIG. 1 the AND gate logic function is implemented by use of NAND gates $14(o)$, $14(1)$ ... $14(n)$ coupled to inverter gates $16(o)$, $16(1)$ ... $16(n)$, respectively. Outputs from the NAND gates 14 and from the inverter gates 16 provide complement and true outputs $\bar{A}$, $A$, respectively, and are designated $A_o$, $\bar{A}_o$, $A_1$, $\bar{A}_1$ ... $\bar{A}_n$.

Each of the $2(m+1)$ inputs are coupled to each AND gate 12 by a plurality of electrically erasable fuses 18. To make all the appropriate connections, $2(m+1)$ x $(n+1)$ fuses are provided. Due to the logic operation performed by fuses 18, to be discussed, the signals provided to inputs 10 are logically inverted by inverters 19 and then supplied to fuses 18. By selectively programming the fuses 18, selected ones of the various input signals $I_o$, $\bar{I}_o$ - $I_m$, $\bar{I}_m$ may be logically supplied as desired to each AND gate 14. This thus provides the capability of implementing arbitrary logic equations from a single integrated circuit logic array.

Figure 2:
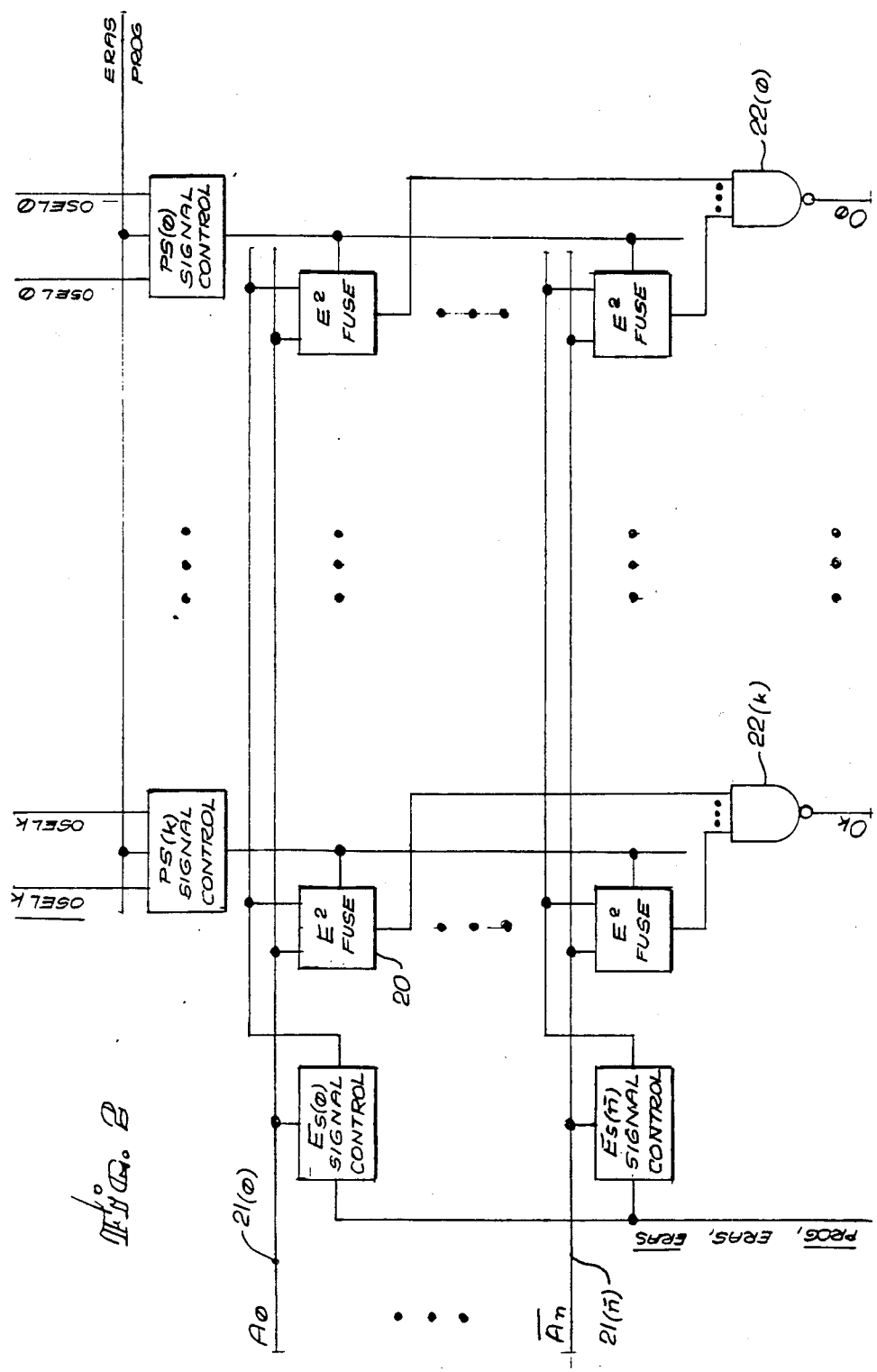
FIG. 2 is a block schematic diagram of a programmable OR gate array of the present invention.

In FIG. 2, a preferred embodiment of a programmable array of OR logic gates of the present invention is shown in block schematic form. Since in practice such a programmable logic OR array will often be combined at the second logic level with a logic AND array such as shown in FIG. 1, the input signals supplied to the OR array of FIG. 2 are shown as $A_o$, $\bar{A}_o$ - $A_n$, $\bar{A}_n$ in correspondence with the outputs from the AND array of FIG. 1. Analogously to the AND array of FIG. 1, the OR array shown in FIG. 2 connects each of the $2(n+1)$ inputs $21(o)$ - $21(\bar{n})$ for the input signals $A_o$, $\bar{A}_o$ - $A_n$, $\bar{A}_n$, respectively, to each of $(k+1)$ OR gates by virtue of a plurality of electrically erasable fuses 20. As will be discussed in more detail below, the particular logical operation of the electrically erasable fuse allows the OR gates of FIG. 2 to be readily implemented in the form of NAND gates 22. This follows from the action of the electrically erasable fuse 20 as an inverter in conjunction with De Morgan's theorem that a NAND gate may be substituted for an OR gate by inverting all inputs. As in the case of the AND array shown in FIG. 1, the state of the electrically erasable fuse 20, i.e. programmed or unprogrammed, determines whether a specific input $A(i)$ is logically connected to a particular NAND gate 22 (j).

FIGS. 1 and 2 also show programming and read lines forming part of the AND and OR logic array. The programming and read circuitry controls the high voltages needed for programming and erasure of the fuses as well as the signals needed to read the state of the electrically erasable fuses during normal logic operation of the array. The operation of these programming and read lines will be explained after discussion of the operation of the electrically erasable fuse 18, 20.

Figure 3:
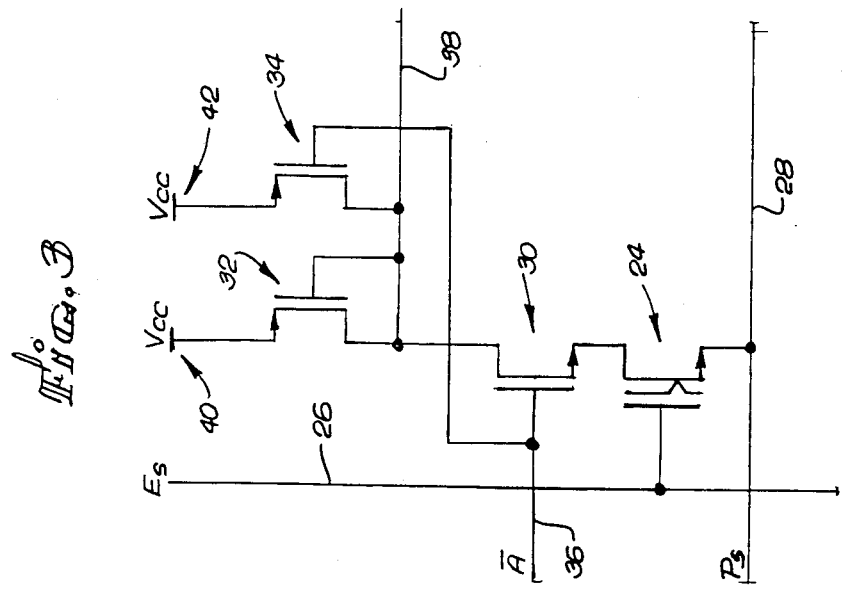
FIG. 3 is a schematic diagram of one embodiment of an electrically erasable fuse employed in the present invention.

In FIG. 3 a preferred embodiment of an electrically erasable fuse 18, 20 is shown. The logic operation of the fuse shown in FIG. 3 may be understood in the context of the AND array of FIG. 1 and the OR array of FIG. 2 by inspection of Table 1. Table 1 shows the truth table of a three input AND gate and three input NAND gate.

TABLE 1

| $I_1$ | $I_2$ | $I_3$ | AND | NAND |
|---|---|---|---|---|
| 0 | 0 | 0 | 0 | 1 |
| 0 | 0 | 1 | 0 | 1 |
| 0 | 1 | 0 | 0 | 1 |
| 0 | 1 | 1 | 0 | 1 |
| 1 | 0 | 0 | 0 | 1 |
| 1 | 0 | 1 | 0 | 1 |
| 1 | 1 | 0 | 0 | 1 |
| 1 | 1 | 1 | 1 | 0 |

As may be seen from inspection of Table 1, the logic of a three input array becomes precisely that of a two input array where the first input signal $I_1$ is held at a high logic level. Therefore, the inputs to the AND array of FIG. 1 or to the OR array of FIG. 2 may be effectively removed from the logic equation for any specified AND or NAND gate to which they are coupled by causing those inputs supplied to that gate to be held at a logic high level. In other words, if the electrically erasable fuses are considered programmed when they maintain an input as part of the logic operation of the AND or OR array and erased if they logically remove the input from the logic array, then this latter function of the fuse may be accomplished by having the fuse output held at a logic high level when the fuse is erased.

A further feature of the electrically erasable fuses 18, 20 is a capability of integrating with the preferred implementation of the logic arrays in terms of NAND gates. NAND gates are preferred due to their speed advantage over NOR gates. For example, in relation to the OR logic array of FIG. 2, it is necessary that the inputs to the NAND gates 22 be inverted to allow the logical OR operation to be performed. Therefore, the electrically erasable fuse may integrate effectively with the NAND gate implementation of the logic array shown in FIG. 1 and FIG. 2 by operating as an inverter when the fuse is programmed.

The logic characteristics of the fuse as described are shown in Table 2 where a logic 1 for the fuse indicates the fuse is programmed and a logic 0 indicates the fuse is erased.

TABLE 2

| A | A | Fuse | Output (38) |
|---|---|------|-------------|
| 0 | 1 | 1 | 1 |
| 1 | 0 | 1 | 0 |
| 0 | 1 | 0 | 1 |
| 1 | 0 | 0 | 1 |

As may be seen from inspection of Table 2, the logic characteristics of the fuse are those of a NAND gate. In other words, if the programming state of the fuse is considered as one input and the other input the logic array input to that fuse, the output of the fuse will be that of a NAND gate.

Referring to FIG. 3, the implementation of the electrically erasable fuse 18, 20 shown provides the desired NAND gate logic operation in a CMOS (complementary metal oxide semiconductor) implementation. The embodiment of the fuse circuit shown in FIG. 3 employs an electrically erasable n-channel transistor 24, an n-channel MOSFET transistor 30, and two p-channel MOSFET transistors 32, 34 coupled to power supplies 40 and 42 respectively.

The electrically erasable transistor 24 is of a type known in the art. For example, such electrically erasable transistors and references relating thereto are discussed in Silicon Integrated Circuits, Part A, Edited by Dawon Kahng, Academic Press, p. 221-224. Transistor 24 is of the type which employs Fowler-Nordheim tunneling in conjunction with a floating gate configuration for both programming and erasure of the transistor. The electrically erasable transistor 24 is in a conducting state when it is programmed and in a nonconducting state when it is erased.

The erasure and programming of transistor 24 are accomplished by use of erase/read signal $E_s$ provided along line 26 and program signal $P_s$ provided along line 28. During normal logic operation a +5 volt signal is supplied along line 26 to the gate of transistor 24. Therefore, during normal logic operations, if the transistor 24 is programmed the transistor will be in a D.C. conductive state due to the voltage supplied to the gate. Furthermore, the load characteristics of transistor 24 will be relatively constant during normal logic operations and will not vary during switching of an input signal A. If transistor 24 is erased, however, it will be nonconducting despite the 5 volt read voltage supplied along line 26 to its gate.

Erasure of transistor 24 is done by holding the input signal A provided along line 36 at zero volts and raising the signal $E_s$ provided along line 26 to a high voltage, approximately 15 volts, and holding the signal $P_s$ provided along line 28 at zero volts. This combination of voltages causes so-called Fowler-Nordheim tunneling to occur onto the floating gate of transistor 24 thereby causing charge to accumulate on the floating gate. This in turn alters the threshold voltage of transistor 24 preventing transistor 24 from becoming turned on with the +5 volt read voltage supplied along line 26. Because the input signal A is at zero volts during erasure, the drain of the programmable transistor 24 is floating and very little current is drawn through it. This in turn results in relatively little power dissipation during the erase operation.

Programming of transistor 24 is done by grounding the signal $E_s$ provided along line 26 to the gate of transistor 24 and raising the signal $P_s$ provided along line 28 to 15 volts. Since the gate of transistor 24 is grounded during programming, the impedance of transistor 24 is high. As a result, the programming operation also draws very little current and results in very little power dissipation.

During normal logic operation signal $E_s$ will be maintained at +5 volts and when transistor 24 is in a programmed state it will be conducting and line 28 will be connected to ground. Accordingly, transistor 24 will connect n-channel MOSFET transistor 30 to ground and the fuse circuit will operate as an inverter. More specifically, when the signal A supplied along line 36 is high, n-channel transistor 30 will be turned on and the voltage supplied along line 38 to the output will be pulled to ground. P-channel MOSFET transistor 32 has its gate and drain connected and acts as a load between the +5 voltage source 40 and ground. When the input signal A supplied along line 36 is low, n-channel MOSFET 30 is turned off and p-channel MOSFET 34 is turned on and the output supplied along line 38 rises to a high level. Thus the circuit shown in FIG. 3 operates as a logic inverter when transistor 24 is in a programmed state.

When transistor 24 is in an erased state its threshold voltage is raised such that the +5 volt read signal supplied along line 26 will not make transistor 24 conducting. In this erased state of transistor 24 the output provided along line 38 is held at a logic high. This is true since irrespective of the state of conductance of n-channel transistor 30, the nonconducting state of programmable transistor 24 prevents the voltage supplied to the output from voltage supplies 40, 42 from being pulled down to ground. Accordingly, the voltage output is maintained at the +5 voltage from voltage supplies 40, 42.

Therefore, the electrically erasable fuse as shown in FIG. 3 implements the desired logic as set out in Table 2. Furthermore, the implementation shown in FIG. 3 provides a CMOS integrated circuit which takes advantage of the well-known advantages of CMOS such as low power consumption, high noise immunity, reliability, etc.

Another advantage of the circuit implementation of the fuse shown in FIG. 3 is that programmable transistor 24 when in a programmed state will be in a D.C. conducting state during logic operations. This has a considerable speed advantage over a logic array where the conductive state of the programmable transistor varies with the input logic level. This is due to the high capacitance of floating gate programmable transistors which have corresponding slow switching characteristics. Since all switching in the circuit of FIG. 3 is carried out by the n-channel transistor 30 and programmable transistor 24 remains in a D.C. conducting state throughout, the speed of the fuse is greatly enhanced.

In FIGS. 1 and 2, programming means for controlling programming of fuses 18, 20 and for controlling logic operations of the logic array, is disclosed. The electrically erasable fuse 18, 20 require complex signals to control three different operating states: (1) normal logic operation; (2) programming; and (3) erasure. The programming means shown in FIGS. 1 and 2 allows control of the three noted operating states of each of the 2(m+1)x 2(n+1)x(k+1) fuses and the logic array with relatively few control signals and relatively few lines. The programming means in one embodiment includes erase/read signal control circuitry 44, program signal control circuitry 46 and external signal control lines 45, 47 and 49.

In one embodiment of the present invention the function of the programming means may be implemented as follows. During normal logic operation of the logic gate array the erase signals $E_s$ are at +5 volts, the read voltage, and the program signals $P_s$ are at zero volts. During programming operations, the erase signals $E_s$ are at zero volts and the program signal $P_s$ of the selected AND gate is raised to 15 volts. Therefore, all the fuses 18 of the selected AND gate are programmed at once. During erasure of a fuse 18, the program signal $P_s$ of the selected AND gate is at zero volts and the program signals $P_s$ of unselected gates are held at 5 volts. The erase signal $E_s$ of the selected input Iy is raised to 15 volts while the remainder of the inputs remain at zero volts.

The desired control of the three operating states of the array, i.e. programming, erasure and logic operation, may be achieved by three externally supplied signals ERAS, ASEL, and PROG supplied along lines 45, 47 and 49 as shown in FIG. 1, along with signals supplied to the inputs 10 to the logic array. These externally supplied control signals are provided to erase-/read signal ($E_s$) control circuitry 44(o) - 44(m) and program signal ($P_s$) control circuitry 46 (o) - 46 (n) which provide the signals to fuses 18 necessary to control the three operating states of the array.

PROG is a signal which is a logic high when the programming operation is selected and a logic low otherwise. ERAS is a logic high when the erase operation is selected and a logic low otherwise. ASELx is a signal that is a logic high when the xth AND gate is selected and a logic low otherwise. Iy is the input signal provided at the selected logic array input 10(y). The desired relationship between these externally supplied control signals and the signals $P_s$ and $E_s$ supplied to the fuse 18 may thus be represented by the following two equations:

$$P_s(x) = 15v(\text{PROG AND ASELx}) \text{ OR } 5v(\overline{\text{ERAS AND ASELx}}) \quad 1.$$

$$E_s(y) = 15v(\text{ERAS AND Iy}) \text{ OR } 5v(\overline{\text{PROG AND ERAS}}) \quad 2.$$

Application of De Morgan's theorem allows implementation of these logic equations in terms of the NAND logic function as follows:

$$P_s(x) = 15v(\text{PROG NAND ASELx}) \text{ NAND } 5v(\text{ERAS NAND ASELx}) \quad 3.$$

$$E_s(y) = 15v(\overline{\text{ERAS NAND Iy}}) \text{ NAND } 5v(\overline{\text{PROG NAND ERAS}}) \quad 4.$$

Figure 4:
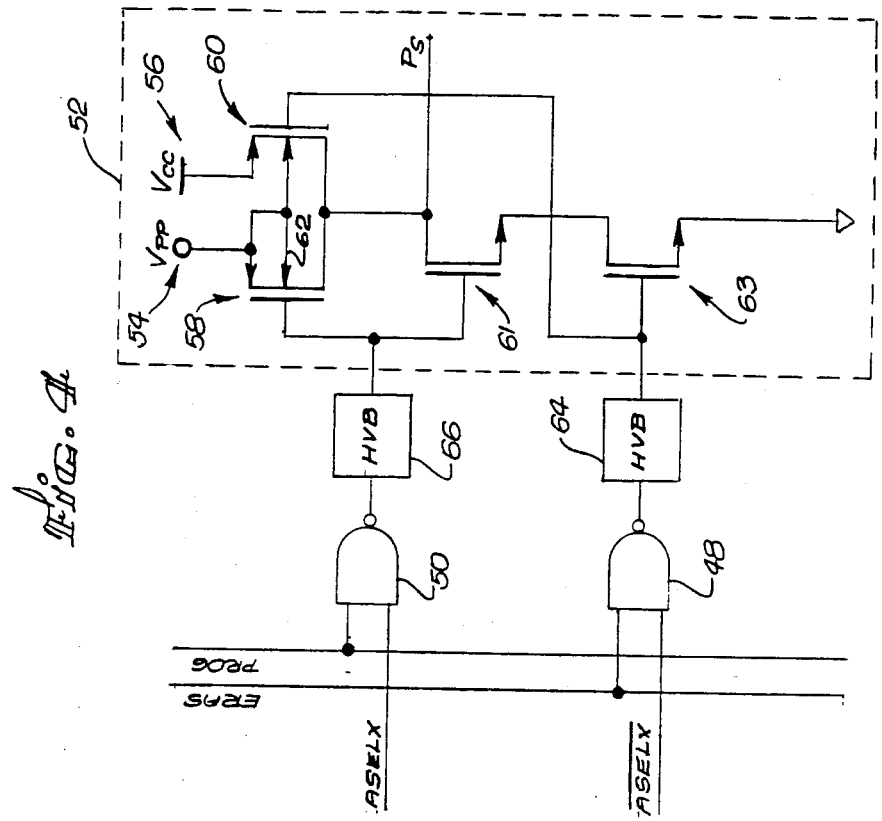
FIG. 4 is a block schematic diagram of one embodiment of a program signal control circuit employed in the present invention.

The circuit implementation of these logic equations as programming and erase signal control circuitry 46, 44 will result in the desired control signals being applied to the fuses 18 upon application of the appropriate externally supplied control signals. The implementation of logic equation 3 for $P_s$ in its NAND gate form is shown in FIG. 4. The NAND gate implementation of the $E_s$ logic equation 4 is shown in FIG. 5.

Referring to FIG. 4, it may be seen that logic equation 3 is implemented. NAND gate circuit 48 forms the desired logical NAND operation between inputs ERAS and ASELx. NAND gate 50 implements the desired NAND logic operation between inputs PROG and ASELx. The logical NAND operation on the outputs of NAND gates 48 and 50 required by the logic equation 3 for $P_s(x)$ is implemented by NAND gate circuit 52. NAND gate circuit 52 employs four CMOS transistors, two p-channel transistors 5B, 60 and two n-channels 61, 63, coupled to implement the NAND logic function. The output from NAND gate 52 must switch between 0 volts and 5 volts for one of the inputs while switching between 0 volts and 15 volts for the other input in order to properly implement logic equation 3 for $P_s(x)$. NAND gate 52 differs from a conventional CMOS NAND gate in that it has two different voltage supplies, 15 volts ($V_{pp}$) supply 54 and 5 volts ($V_{cc}$) supply 56. This allows the output $P_s$ from NAND gate 52 to correctly switch between the three desired output voltage levels, 0 volts, +5 volts and +15 volts. To allow proper operation of the CMOS transistors in NAND gate 52, the most positive circuit voltage +15 volts is suplied to the substrates of the p-channel transistors 5B and 60 as is explicitly shown by line 62.

The circuit of FIG. 4 which implements logic equation 3 for signal $P_s(x)$ also employs two high voltage buffer circuits 64, 66 which allow the NAND gate 52 to switch correctly. The high voltage buffer circuits 64, 66 take the input signal with a level between zero and 5 volts and produce an output between zero and 15 volts. Without this circuit the gate drive supplied to the CMOS gates of NAND gate 52 would not be high enough to allow proper switching.

Referring to FIG. 5 the $E_s$ signal control circuitry 44 is shown. This circuitry implements logic equation 4 for $E_s(y)$ in NAND gate form in a manner exactly equivalent to the $P_s$ circuitry of FIG. 4. NAND gate 84 performs the desired NAND logic operation on input A and input ERAS as required by logic equation 4. NAND gate 86 performs the desired NAND logic operation on inputs PROG and ERAS. NAND gate circuit 88 performs the desired NAND logic operation on the outputs of NAND gates 84 and 86. NAND gate circuit 88 is the same as NAND gate circuit 52 employed in the $P_s$ control circuitry. To accomplish the desired three level output structure NAND gate 88 employs the same two level power supply as NAND gate 52 shown in FIG. 4. Output $E_s$ supplied on line 90 therefore has the desired logic levels of zero volts, +5 volts and 15 volts required by equation 4. The $E_s$ signal control circuit of FIG. 6 also employs two high voltage buffer circuits 90, 92.

The high voltage buffer circuit 64, 66 and 90, 92 is shown in FIG. 6. As may be seen, this circuit employs a CMOS array of four gates, p-channel MOSFET transistors 68, 70 and n-channel MOSFET transistors 72, 74. P-channel MOSFETs 68, 70 are coupled to dual 15 volt power supplies 76, 78. The circuit thus allows the output voltage supplied along line 80 to switch between zero volts and 15 volts corresponding to the input along line 82 switching between zero volts and 5 volts.

The program signal control circuitry and the erase signal control circuitry shown in FIGS. 4, 5 and 6 described in terms of the AND array of FIG. 1, operate in precisely the same manner for the OR logic array of FIG. 2. In the array shown in FIG. 2, the externally supplied signals are denoted as OSELx, PROG, ERAS and Ay. PROG and ERAS correspond to the signals denoted PROG and ERAS in the AND array of FIG. 1. OSELx corresponds to signal ASELx discussed in relation to FIG. 1 but denotes that the signal selects OR gates rather than AND gates as in FIG. 1. Ay denotes the yth input to the OR array which corresponds to an output signal from the AND array of FIG. 2. The operation of these external control signals is otherwise identical to the corresponding ASELx, PROG, ERAS and Iy as discussed above in relation to the AND array of FIG. 1.

While the present invention has been described in terms of preferred embodiments of AND gate arrays and OR gate arrays, it may be seen that the present invention is equally applicable to any arbitrary array of logic gates or combined arrays of logic gates of different types. Also, while the preferred embodiments have been described in the context of CMOS implementations, the present invention may also be implemented in n-channel or p-channel, whether depletion or enhancement type, and even employing bipolar technology with appropriate changes in the circuit design. Furthermore, it will be appreciated that the specific circuit configurations shown in the preferred embodiments described are capable of considerable rearrangement and modification without departing from the scope of the present invention.

It will be apparent to one skilled in the art that other changes in the details of the preferred embodiments described above may be made and such alternate embodiments are within the scope of the present invention. Thus, the present invention is not intended to be limited to the above-described preferred embodiment and is instead best described by the following claims.

What is claimed is:

1. A programmable logic array comprising:
    a plurality of logic input means for receiving a plurality of input logic signals;
    a plurality of logic gates, each gate having a plurality of inputs;
    a plurality of electrically alterable programmable fuse means, each having an input and an output electrically isolated from the output of any other electrically alterable programmable fuse means and each being programmable into a first state in which said electrically alterable programmable fuse means operates and functions as a logic inverter or into a second state in which said electrically alterable programmable fuse means provides at its output a preselected logic signal;
    means for coupling each input of said plurality of inputs of each logic gate to a selected output of said electricaly alterable programmable fuse means, each input of each logic gate being connected to a different programmable fuse means output than any other logic gate input for connecting the output of each fuse means to only one input of a logic gate and each logic gate input to only one fuse means output, whereby said input means are selectively logically coupled to selected ones of said logic gates; and
    programming means for selectively programming said fuse means.

2. A programmable logic array as set out in claim 1 wherein said electrically alterable programmable fuse means comprises an electrically erasable transistor and one or more transistors coupled to said electrically erasable transistor.

3. A programmable logic array as set out in claim 1 wherein said programming means comprises:
    programming signal control means for providing a programming signal to selected ones of said electrically alterable programmable fuse means; and
    erase signal control means for supplying an erase signal to selected ones of said electrically alterable programmable fuse means.

4. A programmable logic array as set out in claim 1 wherein said logic gates and said electrically alterable programmable fuse means are implemented in a CMOS integrated circuit.

5. The combination as claimed in claim 1 wherein said plurality of electrically alterable programmable fuse means is arranged in a matrix array having rows and columns; one row of fuse means for each one of said logic gates, with the outputs of the fuse means of each row being connected to the inputs of the same logic gate.

6. The combination as claimed in claim 5 further including a primary control line per column, a logic line per column, and a secondary control line per row of said fuse means.

7. A programmable logic array comprising:
    a plurality of logic array input means for receiving a plurality of input logic signals;
    a plurality of logic gates, each gate having a plurality of inputs;
    a plurality of fuse means, each fuse means having an output independent of, and not directly connected to, the output of any other fuse means and each input of each logic gate being selectively connected to a different fuse means output than any other logic gate input whereby the output of each fuse means is connected to only one input of said logic gates for connecting the output of each fuse means to only one input of a logic gate and each logic gate input to only one fuse means output, each fuse means having programmable logic states, for alterably coupling selected ones of said input means to selected ones of said logic gate inputs by performing the NAND logic operation on the input logic signals received by said fuse means from said selected ones of said input means and the programmed logic state of said fuse means and providing the logic output of said NAND operation to said selected ones of said logic gates; and
    programming means for programming selected ones of said fuse means.

8. A programmable logic array as set out in claim 7 wherein said programmable fuse means comprises an electrically erasable transistor and one or more transistors coupled to said electrically erasable transistor.

9. A programmable logic array as set out in claim 8 wherein said electrically erasable transistor opeates in a D.C. mode having approximately constant load characteristics during normal logic operations of said logic array when said fuse means is programmed in a first one of said two programming states.

10. A programmable logic gate array as set out in claim 7 wherein said programming means comprises:
    programming signal control means for providing a programming signal to selected ones of said fuse means; and
    erase signal control means for supplying an erase signal to selected ones of said fuse means.

11. A programmable logic array as set out in claim 7 wherein said fuse means and said logic gates are implemented in a CMOS integrated circuit.

12. A CMOS integrated circuit programmable logic array comprising:
    a plurality of inputs for receiving a plurality of input logic signals;
    a plurality of logic gates each logic gate having a plurality of inputs;

a plurality of electrically erasable fuse means each having an output independent of, and not directly connected to, the output of any other electrically erasable fuse means, and the inputs of each logic gate being connected to the outputs of a selected number of electrically erasable fuse means, each logic gate being connected to a different number of electrically erasable fuse means than any other logic gate, for selectively logically coupling selected ones of said inputs to selected ones of said logic gates and for connecting the output of each fuse means to only one input of a logic gate and each logic gate input to only one fuse means output;

a plurality of program signal control means coupled to selected ones of said logic gates and selected ones of said fuse means, for selectively supplying a programming signal to said selected ones of said fuse means; and a plurality of erase signal control means coupled to selected ones of said fuse means and selected ones of said inputs, for selectively supplying erase signals to said selected ones of said fuse means;

wherein said fuse means is selectively programmed into one of two programming states by selective application of predetermined level signals to said inputs, said program signal control means, and said erase signal control means.

13. A programmable logic array as set out in claim 12 wherein said electrically erasable fuse means operates as a logic inverter when programmed in one of said two programming states and maintains a fixed logic output when in the other of said two programming states.

14. A programmable logic array as set out in claim 12 wherein said electrically erasable fuse means operates logically as a NAND gate with one NAND logic input the programming state of said fuse means and the other NAND logic input the selected input logic signal supplied to said electrically erasable fuse means.

15. A programmable logic array as set out in claim 12 wherein said electrically erasable fuse means comprises an electrically erasable transistor and one or more transistors coupled thereto and wherein said electrically erasable transistor is in a D.C. conductive state with approximately constant load characteristics during normal logic operation of said array when said electrically erasable fuse means is programmed in one of said two programming states.

16. A programmable logic array is set out in claim 12 wherein said program signal control means and said erase signal control means each comprise first and second NAND logic gates coupled to a third NAND logic gate having a two level power supply and providing a three logic level output signal.

17. A programmable logic array comprising:
a plurality of input means for receiving a plurality of input signals;
a plurality of logic gates each having a plurality of inputs;
a plurality of programmable transistor fuse means, each programmable transistor fuse means having an output independent of, and not connected to, the output of any other fuse means, and each one of said plurality of inputs of each logic gate being connected to a different, selected, output of a programmable transistor fuse means than any other logic gate input for connecting the output of each fuse means to only one input of a logic gate and each logic gate input to only one fuse means output, each programmable transistor fuse means having two programming logic states, for providing a relatively constant load conductive current path when in a first one of said two programming states during normal logic operations and a substantially nonconductive path when in the second of said two programming states during normal logic operations; and each means including a programmable transistor and one or more transistor means coupled to said programmable transistor means and said input means and said output means, for providing the NAND logic operation in conjunction with said programmable transistor means on the logic level of said input signal and the logic state of the programmable transistor means and outputting the NAND logical output thereof;

a plurality of program signal control means coupled to selected ones of said logic gates and selected ones of said fuse means, for selectively supplying a programming signal to said selected ones of said programmable transistor means; and a plurality of erase signal control means coupled to selected ones of said programmable transistor fuse means and selected ones of said input means, for selectively supplying erase signals to said selected ones of said programmable transistor fuse means;

wherein each one of said programmable transistor fuse means is selectively programmed into one of said two programming states by selective application of predetermined level signals to said input means, said program signal control means, and said erase signal control means.

18. A programmable logic array as set out in claim 17 wherein said programmable transistor fuse means operates as a logic inverter when programmed in one of said two programming states and maintains a logic high output when in the other of said two programming states.

19. A programmable logic array as set out in claim 17 wherein said programmable transistor fuse means operates logically as a NAND gate with one NAND logic input the programming state of said programmable transistor fuse means and the other NAND logic input the selected input supplied to said programmable transistor fuse means.

20. A programmable logic array as set out in claim 17 wherein said logic gates and said programmable transistor fuse means are implemented in a CMOS integrated circuit.

21. A programmable logic array as set out in claim 17 wherein said programmable transistor means comprises an electrically erasable transistor and said electrically erasable transistor is in a D.C. conductive state with relatively constant load characteristics during normal logic operation of said array when said programmable transistor means is programmed in one of said two programming states.

22. A programmable logic array comprising:
a plurality of inputs for receiving a plurality of input logic signals;
a plurality of logic gates each having a plurality of inputs;
a plurality of electrically erasable fuse means each having an output independent of, and not directly connected to, the output of any other electrically erasable fuse means, and the inputs of each logic gate being connected to the outputs of a selected number of electrically erasable fuse means, each logic gate being connected to a different number of electrically erasable fuse means than any other logic gate, for selectively logically coupling selected ones of said inputs to selected ones of said logic gates and for connecting the output of each fuse means to only one input of a logic gate and each logic gate input to only one fuse means output;

a plurality of program signal control means equal in number to said plurality of logic gates and coupled to selected ones of said electrically erasable fuse means, for selectively supplying a programming signal to said selected ones of said fuse means; and a plurality of erase signal control means equal in number to said plurality of inputs and coupled to selected ones of said electrically erasable fuse means, for selectively supplying erase signals to said selected ones of said fuse means;

wherein said electrically erasable fuse means is selectively programmed into one of two programming states by selective application of predetermined level signals to said inputs, said program signal control means, and said erase signal control means.

23. A programmable logic array as set out in claim 22 wherein said electrically erasable fuse means operates as a logic inverter when programmed in one of said two programming states and maintains a logic high output when in the other of said two programming states.

24. A programmable logic array as set out in claim 22 wherein said electrically erasable fuse means operates logically as a NAND gate with one NAND logic input the programming state of said electrically erasable fuse means and the other NAND logic input the selected input supplied to said electrically erasable fuse means.

25. A programmable logic array as set out in claim 22 wherein said logic gates and said electrically erasable fuse means are implemented in a complementary metal oxide semiconductor integrated circuit.

26. A programmable logic array as set out in claim 22 wherein said electrically programmable and erasable fuse means comprises an electrically erasable transistor and one or more transistors coupled thereto and wherein said electrically erasable transistor is in a D.C. conductive state with relatively constant load characteristics during normal logic operation of said array when said electrically erasable fuse means is programmed in one of said two programming states.

27. In a programmable logic gate array of reprogrammable fuses arranged in rows and columns, each reprogrammable fuse comprising:
input means for receiving a logic input signal;
output means;
a first programmable transistor and a second transistor of one conductivity type, a third transistor of complementary conductivity type; each one of said transistors having first and second electrodes defining the ends of a conduction path and a control electrode;
said programmable transistor having two programming logic states, for providing a relatively constant load conductive current path when in a first one of said two programming states during normal logic operations and a nonconductive path when in the second of said two programming states during normal logic operations;
means serially connecting the conduction paths of said first and second transistors between said output means and a first point of operating potential;
means connecting the conduction path of said third transistor between said output means and a second point of operating potential; and
means for coupling the control electrodes of said second and third transistors to said input means for providing the NAND logic operation in conjunction with said programmable transistor means on the logic level of said input signal an the logic state of the programmable transistor means and outputting the NAND logical output thereof.

28. In a programmable logic gate array of electrically erasable fuses arranged in rows and columns, each erasable fuse comprising:
input means for receiving an input signal;
an output;
first and second points of operating potential;
a programmable transistor having two programming logic states; said programming transistor having first and second electrodes defining the ends of a conduction path and a control electrode;
a first transistor of one conductivity type and a second transistor of second conductivity type, each transistor having first and second electrodes defining the ends of a conduction path and a control electrode;
means serially connecting the conduction paths of said first transistor and said programmable transistor between said output and said first point of operating potential and means connecting said second transistor between said output and said second point of operating potential and means coupling said input means to the control electrodes of said first and second transistors for providing at said output the logically inverted signal to the input signal provided at said input when said programmable transistor is in a first programming state and providing a fixed logic signal at said output when said programmable transistor is in the second of said two programming states; and
means coupled to the control electrode and one end of the conduction path of said programmable transistor for programming said programmable transistor.

29. A programmable logic array comprising:
a plurality of logic input means for receiving a plurality of input logic signals;
a plurality of electrically alterable programmable fuse means each having an input and an output and each being programmable into either a first state in which said electrically alterable programmable fuse means operates as a logic inverter or into a second state in which said electrically alterable programmable fuse means provides at its output a preselected fixed logic signal said plurality of electrically alterable programmable fuse means being arranged in "N" rows, each having "M" columns;
"N" logic gates, one logic gate per row of electrically alterable programmable fuse means each gate having "M" inputs;
means for coupling the outputs of the "M" electrically alterable programmable fuse means of each row to a different one of the "M" inputs of its corresponding logic gate for connecting the output each fuse means to only one input of a logic gate and each logic gate input to only one fuse means output; and
programming means for selectively programming said programmable fuse means; where M is an integer greater than two.

* * * * *